United States Patent
Fujii et al.

[11] Patent Number: 6,104,128
[45] Date of Patent: Aug. 15, 2000

[54] PIEZOELECTRIC CERAMICS AND PIEZOELECTRIC TRANSFORMER FORMED THEREFROM

[75] Inventors: Akira Fujii, Yokkaichi; Takumi Kataoka; Hiroo Imamura, both of Nukata-gun; Eturo Yasuda, Okazaki, all of Japan

[73] Assignee: Denso Corporation, Kariya, Japan

[21] Appl. No.: 09/335,181

[22] Filed: Jun. 17, 1999

[30] Foreign Application Priority Data

Jun. 18, 1998 [JP] Japan .................... 10-189798

[51] Int. Cl.$^7$ ............... H01L 41/187; H01L 41/107
[52] U.S. Cl. ................................. 310/358; 310/359
[58] Field of Search ............................ 310/358, 359

[56] References Cited

U.S. PATENT DOCUMENTS

| | | | |
|---|---|---|---|
| 4,568,848 | 2/1986 | Ogawa | 310/358 |
| 4,605,876 | 8/1986 | Ogawa et al. | 310/358 |
| 4,862,029 | 8/1989 | Kasai et al. | 310/358 |
| 5,402,791 | 4/1995 | Saitoh et al. | 310/358 |
| 5,410,209 | 4/1995 | Yamashita et al. | 310/334 |
| 5,804,907 | 9/1998 | Park et al. | 310/358 |

FOREIGN PATENT DOCUMENTS 8-151264   6/1996   Japan ................. C04B 35/49

*Primary Examiner*—Thomas M. Dougherty
*Attorney, Agent, or Firm*—Pillsbury Madison & Sutro LLP

[57] ABSTRACT

PZT piezoelectric ceramics for forming a piezoelectric transformer includes a main composition consisting of Pb$[Zr_A Ti_B (Zn_{1/3} Nb_{2/3})_C (Mn_{1/2} W_{1/2})_D]O_3$. When A/B is in a range of 0.92–1.13, C is 0 or larger, D is in a range of 0.02–0.08 and total of A, B, C and D is 1, the piezoelectric transformer is fired at 1,100° C. or lower, while having relatively high voltage rising ratio and efficiency. Therefore, a relatively low-priced Ag—Pd electrode having heat resistance of approximately 1,100° C. can be used as an inside electrode of a laminated-type transformer. Thus, production cost of the piezoelectric transformer is reduced while the transformer has relatively high voltage rising ratio and efficiency.

12 Claims, 2 Drawing Sheets

L48×W7.2×T2.2mm

PIEZOELECTRIC CERAMICS AND PIEZOELECTRIC TRANSFORMER FORMED THEREFROM

CROSS REFERENCE TO RELATED APPLICATION

This application relates to and claims priority from Japanese Patent Application No. 10-189798 filed on Jun. 18, 1998, the contents of which are hereby incorporated by reference.

BACKGROUND OF THE INVENTION

1. Field of the Invention

The present invention relates generally to piezoelectric ceramics, and particularly to lead zirconate titanate (PZT) piezoelectric ceramics suitably used for forming a piezoelectric transformer. The present invention also relates to the piezoelectric transformer made from PZT piezoelectric ceramics.

2. Related Art

A conventional piezoelectric transformer made from piezoelectric ceramics is incombustible, is smaller in size and has higher efficiency in comparison with an electromagnetic transformer using a coil. Therefore, recently, application of the piezoelectric transformer is considered for various equipments including an inverter for turning on a cold-cathode tube used as a back light of a liquid crystal display. PZT piezoelectric ceramics is widely used to form the piezoelectric transformer. Various compositions of PZT piezoelectric ceramics are proposed to obtain higher voltage rising ratio and efficiency of the piezoelectric transformer. JP-A-8-151264 discloses such a composition of PZT piezoelectric ceramics.

On the other hand, various structures of the piezoelectric transformer are also proposed. It has been found that a laminated-type piezoelectric transformer formed by laminating plural plates made of piezoelectric ceramics has relatively high voltage rising ratio. However, the laminated-type piezoelectric transformer has plural inside electrodes formed between each adjacent piezoelectric ceramics plates. After the inside electrodes are formed, the piezoelectric ceramics plates are fired at 1,200° C. or higher to form the piezoelectric transformer. Therefore, heat resistance of the inside electrode needs to be 1,200° C. or higher. Accordingly, a relatively low-priced silver (Ag) electrode having relatively low heat resistance can not be used as the inside electrode. As a result, a relatively high-priced platinum (Pt) electrode may need to be used as the inside electrode, and production cost of the piezoelectric transformer is increased.

SUMMARY OF THE INVENTION

In view of the foregoing problems, it is an object of the present invention to provide PZT piezoelectric ceramics for forming a piezoelectric transformer which is fired at relatively low temperature and has relatively high voltage rising ratio and efficiency.

According to the present invention, piezoelectric ceramics for forming a piezoelectric transformer includes a main composition consisting of Pb $[Zr_A Ti_B(Zn_{1/3}Nb_{2/3})_C(Mn_{1/2}W_{1/2})_D]O_3$. When A/B is in a range of 0.92–1.13, C is larger than 0, D is in a range of 0.02–0.08 and total of A, B, C and D is 1 in Pb $[Zr_A Ti_B(Zn_{1/3}Nb_{2/3})_C(Mn_{1/2}W_{1/2})_D]O_3$, the piezoelectric transformer is fired at 1,100° C. or lower, and has relatively high voltage rising ratio and efficiency.

Therefore, a relatively low-priced Ag—Pb electrode having heat resistance of approximately 1,100° C. can be used as an inside electrode of a laminated-type piezoelectric transformer. As a result, production cost of the piezoelectric transformer is reduced. Even when C is 0 in Pb $[Zr_A Ti_B (Zn_{1/3}Nb_{2/3})_C(Mn_{1/2}W_{1/2})_D]O_3$, the transformer still can be fired at 1,100° C. or lower and has relatively high voltage rising ratio and efficiency.

Preferably, the piezoelectric ceramics includes Mn at 2 mole % or less as a sub-composition. As a result, voltage rising ratio and efficiency of the transformer are further improved.

Preferably, the piezoelectric ceramics is formed into a flat plate, and the transformer is formed by laminating plural of the flat plates. Thereafter, an input electrode and an output electrode are formed on a surface of the transformer.

As a result, the transformer is readily formed at a relatively low production cost.

BRIEF DESCRIPTION OF THE DRAWINGS

This and other objects and features of the present invention will become more readily apparent from a better understanding of the preferred embodiment described below with reference to the accompanying drawings, in which.

DETAILED DESCRIPTION OF THE PREFERRED EMBODIMENT

A preferred embodiment of the present invention is described hereinafter with reference to the accompanying drawings.

PZT piezoelectric ceramics for forming a piezoelectric transformer (hereinafter referred to as transformer) according to a preferred embodiment of the present invention includes a main composition consisting of Pb $[Zr_A Ti_B(Zn_{1/3} Nb_{2/3})_C(Mn_{1/2}W_{1/2})_D]O_3$ (hereinafter referred to as a general formula (1)). In the general formula (1), A/B is in a range of 0.92–1.13, C is larger than 0, D is in a range of 0.02–0.08 and total of A, B, C and D is 1. Each of A, B, C and D is appropriately determined so that the piezoelectric transformer is fired at desired temperature and has desired performance. A/B represents a ratio of zirconium (Zr) to titanium (Ti) and influences performance of the transformer. When A/B is in a range of 0.92–1.13, both voltage rising ratio and efficiency of the transformer are relatively high. Manganese (Mn) and tungsten (W) decrease fired temperature of the transformer. When D is in a range of 0.02–0.08, fired temperature of the transformer is decreased to 1,100° C. or lower without worsening performance of the transformer. Zinc (Zn) and niobium (Nb) stabilize performance of the transformer. However, when C is increased, fired temperature of the transformer is also increased. Therefore, C is set to be larger than 0 and is appropriately determined so that the transformer has desired fired temperature and performance. Preferably, C is in a range of 0–0.03 so that fired temperature of the transformer is restricted from largely rising.

When C is 0 in the general formula (1), the transformer does not include any Zn and Nb. In this case, the transformer still has sufficiently high performance and sufficiently low fired temperature. Piezoelectric ceramics not including Zn and Nb is represented by Pb $[Zr_A Ti_B(Mn_{1/2}W_{1/2})_D]O_3$ (hereinafter referred to as a general formula (2)). In the general formula (2), A/B is in a range of 0.92–1.13, D is in a range of 0.02–0.08, and total of A, B and D is 1.

Piezoelectric ceramics for forming the transformer may include Mn at 2 mole % or less as sub-composition. That is, Mn may be included in piezoelectric ceramics at 2 mole % of piezoelectric ceramics. When Mn is added to piezoelectric ceramics excessively, voltage rising ratio of the transformer is increased. However, when quantity of Mn in piezoelectric ceramics is excessively increased, performance of the transformer is worsened. Therefore, preferably, piezoelectric ceramics includes Mn at 2 mole % or less.

Figure 1:
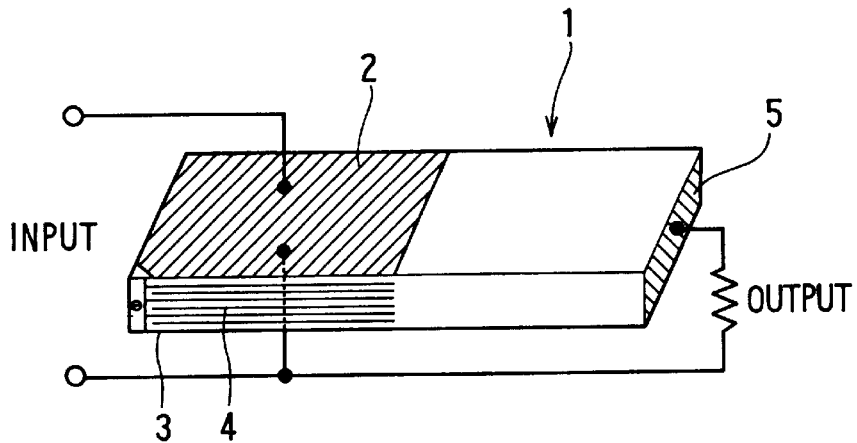
FIG. 1 is a perspective view showing a piezoelectric transformer made from piezoelectric ceramics according to a preferred embodiment of the present invention.
Figure 2A:
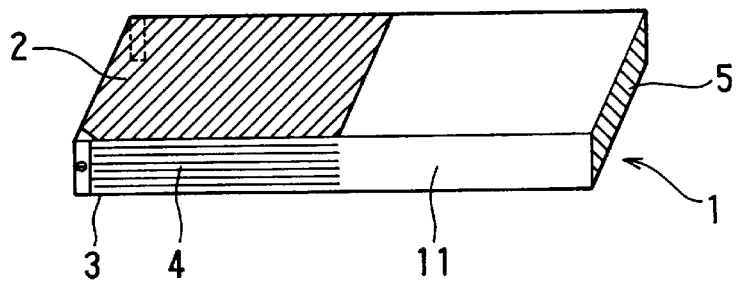
FIG. 2A is a perspective view showing the piezoelectric transformer according to the embodiment.
Figure 2B:
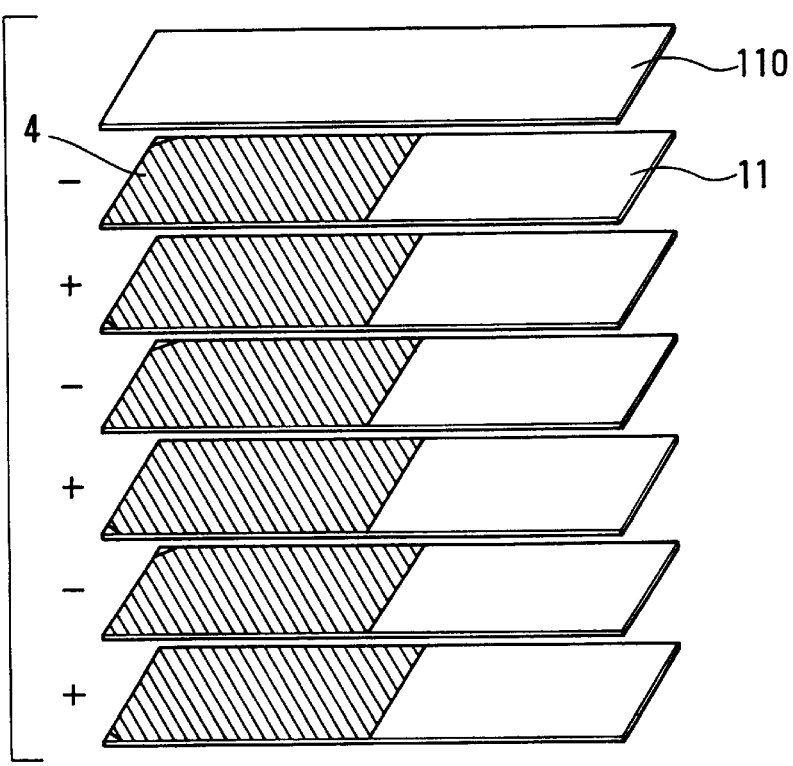
FIG. 2B is an disassembled view of FIG. 2A.

FIGS. 1–2B show a laminated-type piezoelectric transformer made from piezoelectric ceramics according to the present invention. As shown in FIG. 1, the laminated-type transformer has a laminated body 1, input electrodes 2, 3 and an output electrode 5 formed on a surface of the laminated body 1. As shown in FIGS. 2A, 2B, the laminated body 1 is formed by laminating plural piezoelectric transformation element plates 11 (hereinafter referred to as element plates 11). Each of the element plates 11 is made of piezoelectric ceramics having the above-mentioned composition and is formed into a flat-plate shape. In FIG. 1, the input electrodes 2, 3 are respectively formed on a left-half of upper and lower surfaces of the laminated body 1. The output electrode 5 is formed on a right side surface of the laminated body 1. Generally, silver (Ag) electrodes are used as the input electrodes 2, 3 and the output electrode 5.

In the laminated body 1, plural inside electrodes 4 are formed between each adjacent element plates 11. First, as shown in FIG. 2B, either a positive electrode or a negative electrode is formed on a left-half of each upper surface of the element plates 11 as the inside electrode 4. Next, a triangular portion is cut off from each front left edge portion of the element plate 11 having the positive electrode. Similarly, a triangular portion is cut off from each rear left edge portion of the element plate 11 having the negative electrode. Then, the element plates 11 are laminated so that the element plate 11 having the positive electrode and the element plate 11 having the negative electrode are laminated alternately. Thereafter, an outside positive electrode and an outside negative electrode are respectively formed on a surface of the rear left edge portion and on a surface of the front left edge portion of the laminated body 1. The positive electrode and the negative electrode of each element plate 11 are connected to either the outside positive electrode or the outside negative electrode. In the embodiment, the inside electrode 4 is made of a silver-palladium (Ag—Pd) electrode.

The Ag—Pd electrode is relatively low-priced and has heat resistance of approximately 1,100° C.

Next, a manufacturing method of the above-mentioned laminated-type transformer will be described. Each element plate 11 is made of powdered carbonate or oxide such as PbO, $TiO_2$, $ZrO_2$, MnO, $WO_3$, $ZnO_2$ and $Nb_2O_5$, i.e., oxide of element contained in piezoelectric ceramics for forming the transformer. First, the material powders are mixed so that the mixed powder has a desired composition. The mixed powder is added with dispergent, water or the like and is mixed together through wet blending. The mixture is dried, calcinated and ground. The ground material is added with binder and is formed into a flat plate. Ag—Pd paste is applied on a left-half of an upper surface of the flat plate, thereby forming the inside electrode 4. Thus, the element plate 11 is formed. Next, plural element plates 11 are laminated to form the laminated body 1. At this point, a piezoelectric transformation element plate 110 on which Ag—Pd paste is not applied is laminated as a top layer of the laminated body 1. Thus, the laminated body 1 is formed. Next, the laminated body 1 is fired, and then Ag paste is printed on the laminated body 1 so that the input electrode 2, the input electrode 3 and the output electrode 5 are respectively formed on the left-half of upper surface, the left-half of the lower surface and the right side surface of the laminated body 1. Further, the outside positive electrode and the outside negative electrode are respectively formed on the left rear edge portion and the left front edge portion of the laminated body 1 by printing Ag paste thereon. Both the outside positive electrode and the outside negative electrode are connected to the inside electrodes 4. Finally, the laminated body 1 is polarized. Thus, the laminated-type transformer is formed.

Generally, when quantity of Ag in the Ag—Pd electrode is increased, a price of the Ag—Pd electrode is decreased. On the other hand, when quantity of Pd in the Ag—Pd electrode is increased, heat resistance of the Ag—Pd electrode is also increased. The Ag—Pd electrode in which Ag/Pd is 7/3 has heat resistance of approximately 1,100° C. and a relatively low price, and is suitably used as the inside electrode 4. In the present embodiment, fired temperature of the transformer is generally in a range of 950–1,100° C. That is, fired temperature of the transformer can be lower than 1,100° C. according to a composition of piezoelectric ceramics for forming the transformer. Therefore, quantity of Pd. in the Ag—Pd electrode can be further decreased depending on fired temperature of the transformer, so that the cost of the Ag—Pd electrode is further decreased.

Figure 3:
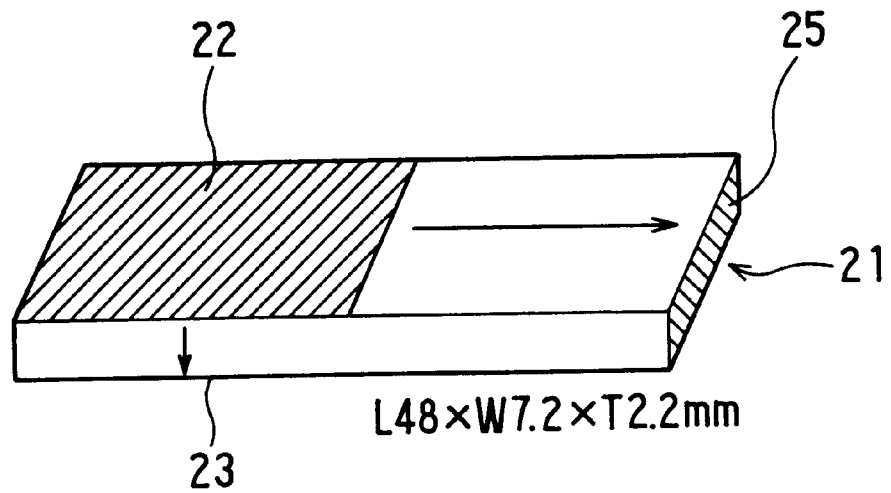
FIG. 3 is a perspective view showing a piezoelectric transformation element for performance evaluation according to the embodiment.

Here, composition of the piezoelectric ceramics of the present invention will be described with reference to composition examples 1–16 in TABLES 1 and 2. In TABLES 1 and 2, the composition examples 1–16 are compared with comparisons 1–5. Each of the examples 1–16 of the present invention and the comparisons 1–5 includes a main composition represented by the above-mentioned general formula (1). The compositions of the examples 1–16 are varied on condition that A/B is in a range of 0.90–1.15, D is in a range of 0–0.10, and total of A, B, C and D is 1. A Rosen-type piezoelectric transformation element 21 for performance evaluation (hereinafter referred to as transformation element 21) is made from each of the examples 1–16 and the comparisons 1–5. As shown in FIG. 3, the transformation element 21 is a piezoelectric ceramics fired body and is 48 mm in length, 7.2 mm in width, and 2.2 mm in thickness. Input electrodes 22, 23 are formed on a left-half of an upper surface and a left-half of a lower surface of the transformation element 21, and an output electrode 25 is formed on a right side surface of the transformation element 21.

Next, a manufacturing method of the transformation element 21 will be described. First, material powders such as PbO, $TiO_2$, $ZrO_2$, MnO, $WO_3$, $ZnO_2$ and $Nb_2O_5$ are mixed so that the mixed powder has a composition of each examples 1–16 and comparisons 1–5 in TABLES 1, 2. The mixed powder, zirconia ball, water and dispergent are put in a resin pot and are mixed together therein for 24 hours through wet blending. The mixture is dried at 120° C., and is calcinated in a crucible at 850° C. for 2 hours. The calcinated powder is added with zirconia ball, water and dispergent, and is ground in the resin pot for 24 hours through wet grinding. The ground material is added with 10% polyvinyl alcohol aqueous solution at 5% by weight, and is dried at 120° C. for pelletization. The pelletized material is formed into a flat plate through pressing at 500 kgf/cm² by an oil hydraulic press, and is fired in the crucible at a temperature in a range of 900–1,300° C. for 2 hours. Fired temperature of the flat plate is determined so that density of a fired body is maximal.

The fired body is cut down to have a length of 48 mm, a width of 7.2 mm, and a thickness of 2.2 mm. Further, Ag paste is applied on a predetermined position of the fired body, and is printed thereon at 700° C. Then, the fired body is immersed in insulation oil heated at 150° C., and is applied with direct current voltage of 1.5 kV/mm for 30 minutes. Thereafter, the fired body is polarized in a longitudinal direction thereof and a thickness direction thereof as indicated by arrows in FIG. 3. Thus, the transformation element 21 is prepared.

Figure 4:
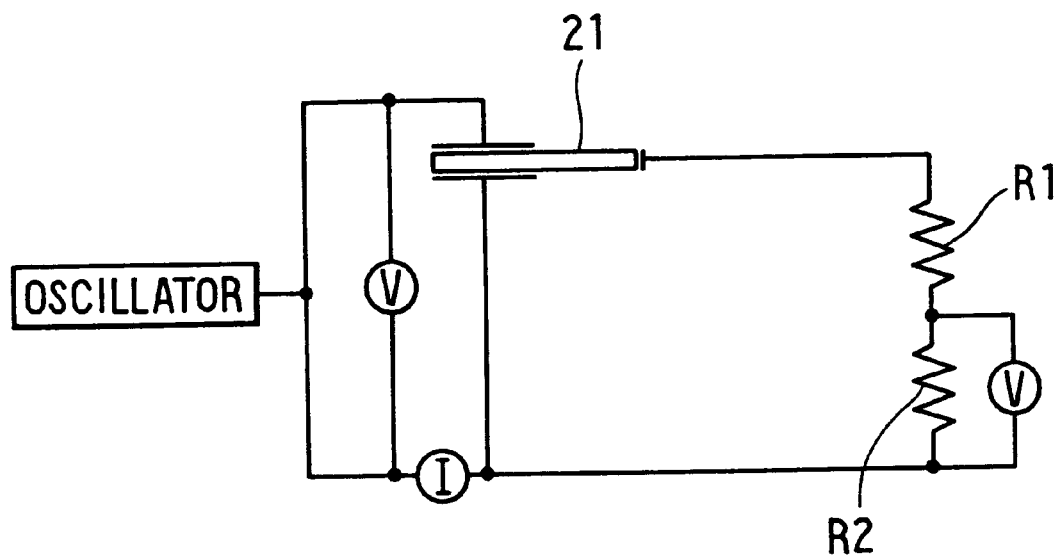
FIG. 4 is a diagram showing a circuit for performance evaluation of the piezoelectric transformation element according to the embodiment.

FIG. 4 shows a circuit structure of a circuit for performance evaluation of the transformation element 21. An oscillator is connected to the input electrodes 22, 23 of the transformation element 21. Voltage having high frequency such as 60–70 kHz which synchronizes with mechanical resonance mode (i.e., λ mode) of the transformation element 21 is input to the input electrodes 22, 23 of the transformation element 21 from the oscillator. Voltage, current and phase difference at this point are measured, and input voltage and input electric power of the transformation element 21 are estimated. On the other hand, a load resistance R1 of 100 kΩ and a current measuring resistance R2 of 100 kΩ for measuring current flowing through the load resistance R1 are connected in series to the output electrode 25 of the transformation element 21. Current in the current measuring resistance R2 is measured, and output voltage and output electric power of the transformation element 21 are estimated from the measured current value. Further, voltage rising ratio and efficiency of the transformation element 21 are estimated. Voltage rising ratio of the transformation element 21 is a ratio of output voltage to input voltage thereof. Efficiency of the transformation element 21 is estimated by multiplying a ratio of output electric power to input electric power thereof by 100. The results are shown in TABLES 1 and 2.

As shown in TABLE 1, the examples 1–6 in which Zr/Ti (A/B) is within a range of 0.92–1.13 have higher voltage rising ratio and efficiency in comparison with the comparisons 1, 2 in which Zr/Ti is out of the range of 0.92–1.13. Therefore, when A/B is in a range of 0.92–1.13, the transformation element 21 has relatively high voltage rising ratio and efficiency.

When comparing the examples 7–10 with the comparisons 3, 4, it shows that fired temperature of the transformation element 21 can be decreased to 1,100° C. or lower when D is over 0.02, but performance of the transformation element 21 is declined when D is over 0.08. Further, as fired temperature of the transformation element 21 increases, performance of the transformation element 21 is largely declined. Therefore, when D is in a range of 0.02–0.08, fired temperature of the transformation element 21 is decreased to 1,100° C. or lower and the transformation element 21 has relatively high performance.

Referring to TABLE 2, the examples 11–13 which excessively include Mn has higher performance than the example 8 which includes no Mn. However, the comparison 5 which includes Mn at 3 mole % has lower performance than the examples 11–13. Therefore, when piezoelectric ceramics includes Mn at 2 mole % or less, performance of the transformation element 21 is relatively high.

The examples 14–16 show that the transformation element 21 has relatively high performance when C is larger than 0, and that fired temperature of the transformation element 21 is increased as C is increased. However, increase in fired temperature of the transformation element 21 is relatively small when C is in a range of 0–0.03.

According to the embodiment of the present invention, piezoelectric ceramics having the above-mentioned composition is used to form a piezoelectric transformer. As a result, the piezoelectric transformer can be fired at lower temperature in a range of 1,100–950° C. and has higher voltage rising ratio and efficiency in comparison with a conventional piezoelectric transformer. Therefore, when a laminated-type piezoelectric transformer is made from the piezoelectric ceramics, a relatively high-priced Pt electrode having relatively high heat resistance does not need to be used as an inside electrode. As a result, production cost of the piezoelectric transformer is reduced while the transformer has high voltage rising ratio and efficiency.

Although the present invention has been fully described in connection with the preferred embodiment thereof with reference to the accompanying drawings, it is to be noted that various changes and modifications will become apparent to those skilled in the art. Such changes and modifications are to be understood as being within the scope of the present invention as defined by the appended claims.

TABLE 1

| | Piezoelectric ceramics composition | | | | Piezoelectric transformer performance | | Fired temperature (° C.) |
|---|---|---|---|---|---|---|---|
| | Main Composition | | | | | | |
| | Zr/Ti (A/B) | $Zn_{1/3}Nb_{2/3}$ (C) | $Mn_{1/2}W_{1/2}$ (D) | Subcomposition (Mn) (mole %) | Voltage rising ratio | Efficiency | |
| Comparison 1 | 1.174 | 0.01 | 0.05 | 0 | 5.2 | 89 | 1,000 |
| Example 1 | 1.128 | 0.01 | 0.05 | 0 | 5.6 | 92 | 1,000 |
| Example 2 | 1.083 | 0.01 | 0.05 | 0 | 5.8 | 95 | 1,000 |
| Example 3 | 1.041 | 0.01 | 0.05 | 0 | 6.0 | 95 | 1,000 |
| Example 4 | 1.000 | 0.01 | 0.05 | 0 | 5.9 | 94 | 1,000 |
| Example 5 | 0.961 | 0.01 | 0.05 | 0 | 5.6 | 93 | 1,000 |
| Example 6 | 0.923 | 0.01 | 0.05 | 0 | 5.5 | 93 | 1,000 |
| Comparison 2 | 0.868 | 0.01 | 0.05 | 0 | 5.0 | 88 | 1,000 |
| Comparison 3 | 1.041 | 0.01 | 0 | 0.5 | 6.0 | 93 | 1,200 |

TABLE 1-continued

| | Piezoelectric ceramics composition | | | | Piezoelectric transformer performance | | Fired |
|---|---|---|---|---|---|---|---|
| | Main Composition | | | | | | |
| | Zr/Ti (A/B) | Zn½Nb⅔ (C) | Mn½W½ (D) | Subcomposition (Mn) (mole %) | Voltage rising ratio | Efficiency | temperature (° C.) |
| Example 7 | 1.041 | 0.01 | 0.02 | 0 | 5.6 | 91 | 1,100 |
| Example 8 | 1.041 | 0.01 | 0.04 | 0 | 5.9 | 95 | 1,000 |
| Example 9 | 1.041 | 0.01 | 0.06 | 0 | 6.0 | 94 | 950 |
| Example 10 | 1.041 | 0.01 | 0.08 | 0 | 5.9 | 94 | 950 |
| Comparison 4 | 1.041 | 0.01 | 0.10 | 0 | 5.6 | 89 | 900 |

TABLE 2

| | Piezoelectric ceramics composition | | | | Piezoelectric transformer performance | | Fired |
|---|---|---|---|---|---|---|---|
| | Main Composition | | | | | | |
| | Zr/Ti (A/B) | Zn½Nb⅔ (C) | Mn½W½ (D) | Subcomposition (Mn) (mole %) | Voltage rising ratio | Efficiency | temperature (° C.) |
| Example 8 | 1.041 | 0.01 | 0.04 | 0 | 5.9 | 95 | 1,000 |
| Example 11 | 1.041 | 0.01 | 0.04 | 0.5 | 6.0 | 95 | 1,100 |
| Example 12 | 1.041 | 0.01 | 0.04 | 1.0 | 6.0 | 95 | 1,000 |
| Example 13 | 1.041 | 0.01 | 0.04 | 2.0 | 5.8 | 93 | 1,000 |
| Comparison 5 | 1.041 | 0.01 | 0.04 | 3.0 | 5.2 | 88 | 1,000 |
| Example 8 | 1.041 | 0.01 | 0.04 | 0 | 6.0 | 95 | 1,000 |
| Example 14 | 1.041 | 0 | 0.04 | 0 | 5.8 | 95 | 1,000 |
| Example 15 | 1.041 | 0.02 | 0.04 | 0 | 5.9 | 94 | 1,050 |
| Example 16 | 1.041 | 0.03 | 0.04 | 0 | 5.9 | 93 | 1,100 |

What is claimed is:

1. Piezoelectric ceramics for forming a piezoelectric transformer, said piezoelectric ceramics comprising:
   a main composition consisting of Pb[$Zr_A Ti_B (Zn_{1/3} Nb_{2/3})_C (Mn_{1/2} W_{1/2})_D$]$O_3$, wherein:
   A/B is in a range of 0.92–1.13;
   C is larger than 0;
   D is in a range of 0.02–0.08; and
   total of A, B, C and D is 1.

2. Piezoelectric ceramics according to claim 1, further comprising manganese at 2 mole % and less.

3. Piezoelectric ceramics for forming a piezoelectric transformer, said piezoelectric ceramics comprising:
   a main composition consisting of [$Zr_A Ti_B (Mn_{1/2} W_{1/2})_D$]$O_3$, wherein:
   A/B is in a range of 0.92–1.13;
   D is in a range of 0.02–0.08; and
   total of A, B and D is 1.

4. Piezoelectric ceramics according to claim 3, further comprising manganese at 2 mole % and less.

5. A piezoelectric transformer comprising:
   an element body for transferring electric energy, said element body being formed using piezoelectric ceramics substantially consisting of Pb[$Zr_A Ti_B (Zn_{1/3} Nb_{2/3})_C (Mn_{1/2} W_{1/2})_D$]$O_3$, wherein A/B is in a range of 0.92–1.13, C is larger than 0, D is in a range of 0.02–0.08, and total of A, B, C and D is 1.

6. The piezoelectric transformer according to claim 5, wherein said piezoelectric ceramics includes manganese at 2 mole % and less.

7. The piezoelectric transformer according to claim 5, further comprising:

an input electrode into which voltage is input; and
an output electrode from which voltage is output, wherein:
said element body is formed into a flat plate; and
said input electrode and said output electrode are formed on a surface of said element body.

8. The piezoelectric transformer according to claim 7, wherein said element body is 48 mm in length, 7.2 mm in width and 2.2 mm in thickness.

9. The piezoelectric transformer according to claim 5, further comprising:
   an input electrode into which voltage is input; and
   an output electrode from which voltage is output, wherein:
   said element body includes a plurality of element portions each of which is formed into a flat plate;
   said plurality of element portions are laminated to form a laminated body; and
   said input electrode and said output electrode are formed on a surface of said laminated body.

10. A piezoelectric transformer comprising:
    an element body for transferring electric energy, said element body being formed using piezoelectric ceramics substantially consisting of Pb[$Zr_A Ti_B (Mn_{1/2} W_{1/2})_D$]$O_3$, wherein A/B is in a range of 0.92–1.13, D is in a range of 0.02–0.08, and total of A, B and D is 1.

11. The piezoelectric transformer according to claim 10, wherein said piezoelectric ceramics includes manganese at 2 mole % and less.

12. The piezoelectric transformer according to claim 10, further comprising:

an input electrode into which voltage is input; and an output electrode from which voltage is output, wherein:

said element body is formed into a flat plate; and said input electrode and said output electrode are formed on a surface of said element body.

* * * * *